United States Patent
Fukada et al.

(10) Patent No.: US 10,262,863 B2
(45) Date of Patent: Apr. 16, 2019

(54) METHOD FOR MANUFACTURING SIC EPITAXIAL WAFER BY SIMULTANEOUSLY UTILIZING AN N-BASED GAS AND A CI-BASED GAS, AND SIC EPITAXIAL GROWTH APPARATUS

(71) Applicants: SHOWA DENKO K.K., Tokyo (JP); CENTRAL RESEARCH INSTITUTE OF ELECTRIC POWER INDUSTRY, Tokyo (JP)

(72) Inventors: Keisuke Fukada, Chichibu (JP); Masahiko Ito, Yokosuka (JP); Isaho Kamata, Yokosuka (JP); Hidekazu Tsuchida, Yokosuka (JP); Hideyuki Uehigashi, Kariya (JP); Hiroaki Fujibayashi, Kariya (JP); Masami Naito, Kariya (JP); Kazukuni Hara, Kariya (JP); Takahiro Kozawa, Nagakute (JP); Hirofumi Aoki, Toyota (JP)

(73) Assignees: SHOWA DENKO K.K., Tokyo (JP); Central Research Institute Of Electric Power Industry, Tokyo (JP)

( * ) Notice: Subject to any disclaimer, the term of this patent is extended or adjusted under 35 U.S.C. 154(b) by 94 days.

(21) Appl. No.: 15/534,317

(22) PCT Filed: Dec. 8, 2015

(86) PCT No.: PCT/JP2015/084386
§ 371 (c)(1),
(2) Date: Jun. 8, 2017

(87) PCT Pub. No.: WO2016/098638
PCT Pub. Date: Jun. 23, 2016

(65) Prior Publication Data
US 2017/0345658 A1    Nov. 30, 2017

(30) Foreign Application Priority Data

Dec. 19, 2014  (JP) .................................. 2014-257834

(51) Int. Cl.
*H01L 21/205* (2006.01)
*C23C 16/32* (2006.01)
(Continued)

(52) U.S. Cl.
CPC .......... *H01L 21/205* (2013.01); *C23C 16/325* (2013.01); *C23C 16/42* (2013.01);
(Continued)

(58) Field of Classification Search
CPC ............... H01L 21/205; H01L 21/0262; H01L 21/02378; H01L 21/02529; C23C 16/325;
(Continued)

(56) References Cited

U.S. PATENT DOCUMENTS 8,940,614 B2 * 1/2015 Loboda ............. H01L 21/02529
117/84
9,139,933 B2 * 9/2015 Tsumori .................. C30B 25/12
(Continued)

FOREIGN PATENT DOCUMENTS

JP    2003-002795 A    1/2003
JP    2004-247692 A    9/2004
(Continued)

OTHER PUBLICATIONS

D. Crippa, et al., "New Achievements on CVD Based Methods for SiC Epitaxial Growth", Materials Science Forum, 2005, pp. 67-72, vols. 483-485.
(Continued)

*Primary Examiner* — Andrew Q Tran
(74) *Attorney, Agent, or Firm* — Sughrue Mion, PLLC

(57) ABSTRACT

A method for manufacturing a SiC epitaxial wafer according to one aspect of the present invention includes separately
(Continued)

introducing, into a reaction space for SiC epitaxial growth, a basic N-based gas composed of molecules containing an N atom within the molecular structure but having neither a double bond nor a triple bond between nitrogen atoms, and a Cl-based gas composed of molecules containing a Cl atom within the molecular structure, and mixing the N-based gas and the Cl-based gas at a temperature equal to or higher than the boiling point or sublimation temperature of a solid product generated by mixing the N-based gas and the Cl-based gas.

9 Claims, 3 Drawing Sheets

(51) Int. Cl.
    *C30B 25/14*     (2006.01)
    *C23C 16/42*     (2006.01)
    *C23C 16/455*     (2006.01)
    *C30B 29/36*     (2006.01)
    *C30B 25/18*     (2006.01)
    *C30B 25/20*     (2006.01)
    *H01L 21/02*     (2006.01)

(52) U.S. Cl.
    CPC ........ *C23C 16/455* (2013.01); *C23C 16/4557* (2013.01); *C23C 16/45574* (2013.01); *C30B 25/14* (2013.01); *C30B 25/186* (2013.01); *C30B 25/20* (2013.01); *C30B 29/36* (2013.01); *H01L 21/0262* (2013.01); *H01L 21/02378* (2013.01); *H01L 21/02529* (2013.01)

(58) Field of Classification Search
    CPC ... C23C 16/455; C23C 16/4557; C30B 25/14; C30B 25/186; C30B 25/20; C30B 29/36
    See application file for complete search history.

(56) References Cited

U.S. PATENT DOCUMENTS

| | | | |
|---|---|---|---|
| 9,873,941 B2 * | 1/2018 | Ito | .......................... C23C 16/325 |
| 2012/0031330 A1 | 2/2012 | Tsumori et al. | |
| 2012/0048180 A1 | 3/2012 | Ito et al. | |

FOREIGN PATENT DOCUMENTS

| | | |
|---|---|---|
| JP | 2008-230924 A | 10/2008 |
| JP | 2011-195346 A | 10/2011 |
| JP | 2011-216848 A | 10/2011 |
| JP | 4839646 B2 | 12/2011 |
| JP | 2012-54528 A | 3/2012 |
| JP | 2012-69904 A | 4/2012 |
| JP | 2014-123617 A | 7/2014 |
| JP | 2014-166957 A | 9/2014 |

OTHER PUBLICATIONS

F. La Via, et al., "4H-SiC epitaxial layer growth by trichlorosilane (TCS)", Journal of Crystal Growth, 2008, pp. 107-113, vol. 311.
International Search Report for PCT/JP2015/084386 dated Mar. 1, 2016 [PCT/ISA/210].
Communication dated Jan. 23, 2018 from the Japanese Patent Office in counterpart Japanese application No. 2014-257834.
Notice of Allowance dated May 29, 2018, issued by the Japan Patent Office in corresponding Japanese Application No. 2014-257834.

* cited by examiner

METHOD FOR MANUFACTURING SIC EPITAXIAL WAFER BY SIMULTANEOUSLY UTILIZING AN N-BASED GAS AND A Cl-BASED GAS, AND SIC EPITAXIAL GROWTH APPARATUS

CROSS REFERENCE TO RELATED APPLICATIONS

This application is a National Stage of International Application No. PCT/JP2015/084386, filed on Dec. 8, 2015, which claims priority from Japanese Patent Application No. 2014-257834, filed on Dec. 19, 2014, the contents of all of which are incorporated herein by reference in their entirety.

TECHNICAL FIELD

The present invention relates to a method for manufacturing a SiC epitaxial wafer and a SiC epitaxial wafer manufacturing apparatus. Priority is claimed on Japanese Patent Application No. 2014-257834, filed Dec. 19, 2014, the content of which is incorporated herein by reference.

BACKGROUND ART

Compared with silicon (Si), silicon carbide (SiC) has superior properties which include a band gap that is about three times greater, an insulation breakdown electric field strength that is about 10 times greater, and a thermal conductivity that is about 3 times higher. SiC therefore holds considerable promise for applications to power devices, high-frequency devices, and high-temperature operation devices and the like. As a result, SiC epitaxial wafers are starting to be being used for semiconductor devices.

SiC epitaxial wafers are manufactured using SiC single crystal substrates, which are processed from SiC bulk single crystals prepared by a sublimation method or the like for use as substrates for forming SiC epitaxial films. A SiC epitaxial wafer is obtained by growing a SiC epitaxial layer on a SiC single crystal substrate using a chemical vapor deposition (CVD) method. SiC epitaxial layers function as the active regions of SiC semiconductor devices.

The performance of a SiC semiconductor device varies depending on the state of the grown SiC epitaxial layer. The manufacture of SiC epitaxial wafers having uniform quality and minimal defects is desirable.

For example, Non-Patent Document 1 discloses a method in which HCl gas is introduced together with the raw material gases during SiC epitaxial growth. Non-Patent Document 2 discloses a method in which trichlorosilane (siHCl$_3$) is used as a raw material gas during SiC epitaxial growth.

Non-Patent Documents 1 and 2 discloses that by using a gas composed of molecules containing a Cl atom within the molecular structure (hereafter referred to as a "Cl-based gas") during SiC epitaxial growth, nucleus growth of Si in the gas phase can be suppressed, and the formation of Si liquid droplets on the wafer surface can also be suppressed. Examples of the Cl-based gas include HCl and chlorosilane-based compounds.

Si nuclei formed in the gas phase and Si liquid droplets on the wafer surface can become defect origins during epitaxial growth. Accordingly, in Non-Patent Documents 1 and 2, a Cl-based gas is used to manufacture SiC epitaxial wafers having minimal defects. Non-Patent Documents 1 and 2 also disclose that by using a Cl-based gas, the growth rate of the SiC epitaxial growth can be increased.

Patent Document 1 discloses the use of ammonia or the like as the dopant gas instead of nitrogen gas. In nitrogen gas, the energy of a triple bond between the N atoms is very high, and controlling the thermal decomposition process is difficult. As a result, when nitrogen gas is supplied to the substrate as an active species that contributes to doping, achieving a uniform distribution for the nitrogen partial pressure across the substrate surface is difficult. Accordingly, by using a dopant such as ammonia that lacks a triple bond, the uniformity of the carrier density for the SiC epitaxial film can be enhanced. Further, Patent Document 1 also discloses that by decomposing the ammonia or the like in advance in a preheating step, the uniformity of the carrier density can be enhanced even further.

PRIOR ART LITERATURE

Patent Document

Patent Document 1: Japanese Patent (Granted) Publication No. 4, 839, 646

Non-Patent Documents

Non-Patent Document 1: D. Crippa et al., Materials Science Forum, Vols. 483 to 485 (2005), pp. 67 to 72

Non-Patent Document 2: F. La Via et al., Journal of Crystal Growth, 311 (2008), 107 to 113.

DISCLOSURE OF INVENTION

Problems to be Solved by the Invention

As described above, the use of a Cl-based gas and a N-based gas (a basic gas composed of molecules containing an N atom within the molecular structure but having neither a double bond nor a triple bond between nitrogen atoms) is already known. However, although investigations relating to both types of gases have been conducted at the laboratory level, use of either type of gas in an actual manufacturing facility has yet to be investigated.

One reason for this is that a Cl-based gas is not essential. Si nucleus formation in the gas phase and Si liquid droplets on the wafer surface can be prevented by ensuring that the Si raw material supply rate is not excessive and the film deposition atmosphere is low pressure. Accordingly, using only silane (SiH$_4$) without using any Cl-based gas has often been adequate.

Another reason is that in the case of epitaxial wafers of 4 inches or smaller, any in-plane non-uniformity in the temperature or gas partial pressure is not particularly large. In other words, in the case of an epitaxial wafers of 4 inches or smaller, even if nitrogen gas is used as a dopant gas, an epitaxial wafer having a satisfactory level of carrier uniformity can still be obtained. In other words, the efficiency of the incorporation of the dopant atoms into the SiC epitaxial wafer is not high compared with nitrogen gas, and therefore no attempts have been made to use N-based gases, which tend to be also difficult to handle.

As outlined above, no investigations have been conducted into the simultaneous use of a N-based gas and a Cl-based gas in a method for manufacturing a SiC epitaxial wafer, and there is no understanding of the problems involved when these gases are used simultaneously.

On the other hand, in recent years, the inventors of the present invention have been conducting investigations into the manufacture of high-quality SiC epitaxial wafers of large sizes exceeding 6 inches. These types of large SiC epitaxial wafers cannot be obtained simply by increasing the scale of various components, and there are many issues that need to be addressed in order to obtain high-quality films. Compared with 4-inch SiC epitaxial wafers, issues such as reducing the number of defects and obtaining a more uniform carrier density become problematic. Further, in recent years, increases in throughput and thicker films for highly voltage-resistant devices are also being demanded, meaning it is desirable to increase the Si raw material supply rate in order to increase the epitaxial growth rate. Accordingly, the effects of using the aforementioned Cl-based gases and N-based gases are becoming increasingly attractive. As a result, the inventors of the present invention were the first to investigate actually the manufacturing epitaxial films using a Cl-based gas and a N-based gas simultaneously.

As a result, they discovered that simply mixing a basic N-based gas composed of molecules containing an N atom within the molecular structure but having neither a double bond nor a triple bond between nitrogen atoms, with a Cl-based gas composed of molecules containing a Cl atom within the molecular structure was not sufficient to enable manufacture of a uniform SiC epitaxial wafer with minimal defects.

As a result of intensive investigation, the inventors of the present invention were the first to discover that when a N-based gas and a Cl-based gas were mixed, a solid product was produced, and that solid product could form defects within the SiC epitaxial wafer. This issue was particularly problematic in methods for manufacturing SiC epitaxial wafers that required the N-based gas and the Cl-based gas to exist simultaneously in the reaction space.

Non-Patent Document 1 discloses the use of HCl gas, but includes no mention of the addition of a dopant gas.

Non-Patent Document 2 discloses the use of trichlorosilane gas, and the use of nitrogen for doping the carrier, but nitrogen has a triple bond and is very stable, and therefore no solid products are formed.

Patent Document 1 discloses the use of N-based gases. However, the gas used as the raw material gas is silane ($SiH_4$), and no mention is made of simultaneous use of HCl gas. The use of chlorosilane compounds such as trichlorosilane instead of the silane gas could be considered, but in FIG. 1 of Patent Document 1, the two gases are mixed at the piping stage.

The piping is generally formed from stainless steel or the like, and is not heated. Accordingly, if these gases were mixed inside the piping, a solid product would form and adhere to the inside of the piping. This adhered solid product can then detach and fly onto the SiC epitaxial wafer in particle form. Particles originating from the detached solid product can cause defects in the SiC epitaxial wafer. For example, particles generated from the solid product and then adhered to the wafer surface can inhibit step-flow growth of the SiC and generate triangular defects originating from these particles. Although dependent on the amounts used and the frequency of use of the N-based gas and the Cl-based gas, mixing and then introducing a N-based gas and a Cl-based gas generally results in surface defects at a rate of at least one defect per $cm^2$. In other words, it is clear from the disclosure of Patent Document 1 that the problem of solid product formation and the problem of this solid product causing defects on the SiC epitaxial wafer were not confronted.

The problem of a solid product being produced and the solid product then causing defects when a N-based gas and a Cl-based gas are used simultaneously on a SiC epitaxial wafer was first identified by the inventors of the present invention during their actual investigations, and no methods for manufacturing SiC epitaxial wafers or SiC epitaxial growth apparatus have yet been proposed that are capable of suppressing defects associated with the solid product produced as a result of using a N-based gas and a Cl-based gas simultaneously.

Accordingly, a method for manufacturing a SiC epitaxial wafer and a SiC epitaxial growth apparatus that are capable of suppressing defects associated with the solid product produced by mixing a N-based gas and a Cl-based gas are eagerly sought.

The present invention has been developed in light of the above circumstances, and has an object of providing a method for manufacturing a SiC epitaxial wafer and a SiC epitaxial growth apparatus that are capable of suppressing defects associated with the solid product produced as a result of using a N-based gas and a Cl-based gas simultaneously.

Means for Solving the Problems

As a result of intensive investigation, the inventors of the present invention discovered that by mixing a N-based gas and a Cl-based gas at a temperature equal to or higher than the boiling point or sublimation temperature of the solid product generated by mixing the N-based gas and the Cl-based gas, the problems described above could be addressed, thus enabling them to complete the present invention.

In other words, in order to achieve the above object, the present invention provides the following aspects.

(1) A method for manufacturing a SiC epitaxial wafer according to one aspect of the present invention includes separately introducing, into a reaction space for SiC epitaxial growth, a basic N-based gas composed of molecules containing an N atom within the molecular structure but having neither a double bond nor a triple bond between nitrogen atoms, and a Cl-based gas composed of molecules containing a Cl atom within the molecular structure, and mixing the N-based gas and the Cl-based gas at a temperature equal to or higher than the boiling point or sublimation temperature of a solid product generated by mixing the N-based gas and the Cl-based gas.

(2) In the method for manufacturing a SiC epitaxial wafer according to (1) above, the temperature of the entire reaction space may be set to a temperature equal to or higher than the boiling point or sublimation temperature of the solid product generated by mixing the N-based gas and the Cl-based gas.

(3) In the method for manufacturing a SiC epitaxial wafer according to (1) or (2) above, the pressure during mixing of the N-based gas and the Cl-based gas may be set to not more than 15 kPa, and is preferably 5 kPa or lower.

(4) In the method for manufacturing a SiC epitaxial wafer according to any one of (1) to (3) above, the N-based gas may be one compound selected from the group consisting of methylamine ($CH_5N$), dimethylamine ($C_2H_7N$), trimethylamine ($C_3H_9N$), aniline ($C_6H_7N$), ammonia ($NH_3$), hydrazine ($N_2H_4$), dimethylhydrazine ($C_2H_8N_2$) and other amines.

(5) In the method for manufacturing a SiC epitaxial wafer according to any one of (1) to (4) above, the Cl-based gas may be HCl or a chlorosilane-based compound.

(6) A SiC epitaxial growth apparatus according to another aspect of the present invention includes a furnace body that forms a growth space, a mounting stage, provided inside the furnace body, on which a SiC wafer is mounted, and gas inlet piping through which gas is introduced into the furnace body, wherein the gas inlet piping has a N-based gas inlet pipe for introducing a basic N-based gas composed of molecules containing an N atom within the molecular structure but having neither a double bond nor a triple bond between nitrogen atoms, and a Cl-based gas inlet pipe for introducing a Cl-based gas composed of molecules containing a Cl atom within the molecular structure, the N-based gas inlet pipe and the Cl-based gas inlet pipe being mutually separate, and a heating device is provided that is capable of heating the inlet ports of the N-based gas inlet pipe and the Cl-based gas inlet pipe to a temperature equal to or higher than the boiling point or sublimation temperature of a solid product generated by mixing the N-based gas and the Cl-based gas.

(7) In the SiC epitaxial growth apparatus according to (6) above, the temperature of the space between the inlet ports of the gas inlet pipes and the mounting stage may be increased to a temperature equal to or higher than the boiling point or sublimation temperature of the solid product generated by mixing the N-based gas and the Cl-based gas.

(8) In the SiC epitaxial growth apparatus according to (6) or (7) above, the distance between the inlet ports of the gas inlet pipes and the mounting stage may be within a range from 200 and 2,000 mm, and is preferably from 300 to 1,000 mm.

(9) In the SiC epitaxial growth apparatus according to any one of (6) to (8) above, the apparatus may have a vertical furnace structure in which the gas inlet piping is positioned above the mounting stage.

Effects of the Invention

The method for manufacturing a SiC epitaxial wafer according to one aspect of the present invention uses a basic N-based gas composed of molecules containing an N atom within the molecular structure but having neither a double bond nor a triple bond between nitrogen atoms, and a Cl-based gas composed of molecules containing a Cl atom within the molecular structure.

Because the N-based gas has neither a double bond nor a triple bond between nitrogen atoms, the energy required for thermal decomposition is small, thus facilitating control of the thermal decomposition process. As a result, the active species contributing to doping of the SiC epitaxial wafer can be distributed uniformly.

The Cl-based gas suppresses Si nucleus growth in the gas phase. Further, the Cl-based gas also suppresses the formation of Si liquid droplets on the wafer surface.

In the method for manufacturing a SiC epitaxial wafer according to one aspect of the present invention, the N-based gas and the Cl-based gas are introduced separately into the reaction space for SiC epitaxial growth, and the N-based gas and the Cl-based gas are then mixed at a temperature equal to or higher than the boiling point or sublimation temperature of the solid product generated by mixing the N-based gas and the Cl-based gas. Because the N-based gas and the Cl-based gas are introduced separately, formation of the solid product in the piping and the like outside of the SiC epitaxial growth reaction space can be inhibited. Further, when the gases are mixed, the mixing is performed at a temperature equal to or higher than the boiling point or sublimation temperature of the solid product. As a result, formation of the solid product can also be suppressed inside the reaction space. Accordingly, a SiC epitaxial wafer can be manufactured with a reduction the number of defects associated with the solid product.

Furthermore, the temperature of the entire reaction space may be set to a temperature equal to or higher than the boiling point or sublimation temperature of the solid product generated by mixing the N-based gas and the Cl-based gas. By increasing the temperature of the entire reaction space, formation of the solid product can be suppressed following mixing of the gases. As a result, a SiC epitaxial wafer can be manufactured with even better reduction in the number of defects associated with the solid product.

The SiC epitaxial growth apparatus according to another aspect of the present invention includes a furnace body that forms a growth space, a mounting stage, provided inside the furnace body, on which a SiC wafer is mounted, and gas inlet piping through which gas is introduced into the furnace body, wherein the gas inlet piping has a N-based gas inlet pipe for introducing a basic N-based gas composed of molecules containing an N atom within the molecular structure but having neither a double bond nor a triple bond between nitrogen atoms, and a Cl-based gas inlet pipe for introducing a Cl-based gas composed of molecules containing a Cl atom within the molecular structure, the N-based gas inlet pipe and the Cl-based gas inlet pipe being mutually separate, and a heating device is provided that is capable of heating the inlet ports of the N-based gas inlet pipe and the Cl-based gas inlet pipe to a temperature equal to or higher than the boiling point or sublimation temperature of a solid product generated by mixing the N-based gas and the Cl-based gas.

As described above, by using a N-based gas and a Cl-based gas, defects can be suppressed, and the epitaxial wafer uniformity can be enhanced. Further, by separating the N-based gas inlet pipe and the Cl-based gas inlet pipe, the N-based gas and the Cl-based gas can be introduced separately into the furnace body, and formation of the solid product in the piping and the like outside of the SiC epitaxial growth reaction space can be inhibited. Moreover, by providing the heating device, which is capable of heating the N-based gas inlet port and the Cl-based gas inlet port to a temperature equal to or higher than the boiling point or sublimation temperature of a solid product generated by mixing the N-based gas and the Cl-based gas, the inlet ports can be heated to a temperature equal to or higher than the boiling point or sublimation temperature of the solid product as the N-based gas and the Cl-based gas are introduced into the furnace body. As a result, the solid product is unable to exist in the solid state, and a SiC epitaxial wafer can be manufactured with a reduction in the number of defects associated with the solid product.

Farther, a configuration may be used in which the temperature of the space between the inlet ports of the gas inlet pipes and the mounting stage heated to a temperature equal to or higher than the boiling point or sublimation temperature of the solid product generated by mixing the N-based gas and the Cl-based gas. By adopting this configuration, formation of the solid product after mixing can also be suppressed, and a SiC epitaxial wafer can be manufactured with even better reduction in the number of defects associated with the solid product.

Furthermore, the distance between the inlet ports of the gas inlet pipes and the mounting stage may be thin a range from 200 to 2,000 mm. Provided the distance between the inlet ports of the gas inlet pipes and the mounting stage is suitably large, any produced solid product can be gasified before falling to the surface of the epitaxial wafer. The distance between the inlet ports of the gas inlet pipes and the mounting stage is more preferably from 300 to 1,000 mm. If the distance is too large, then the heating source must be increased in size, which is undesirable in terms of apparatus costs and running costs.

Moreover, the apparatus may have a vertical furnace structure in which the gas inlet pipes are positioned above the mounting stage. In a vertical furnace structure, the furnace body that functions as the reaction space is larger. As the reaction space becomes larger, radiation has a greater effect on the region surrounding the wafer, and maintaining the temperature at a uniform level becomes more difficult. Consequently, the effect of using an N-based gas that can be gasified before it reaches the wafer surroundings becomes more significant.

BEST MODE FOR CARRYING OUT THE INVENTION

Figure 1:
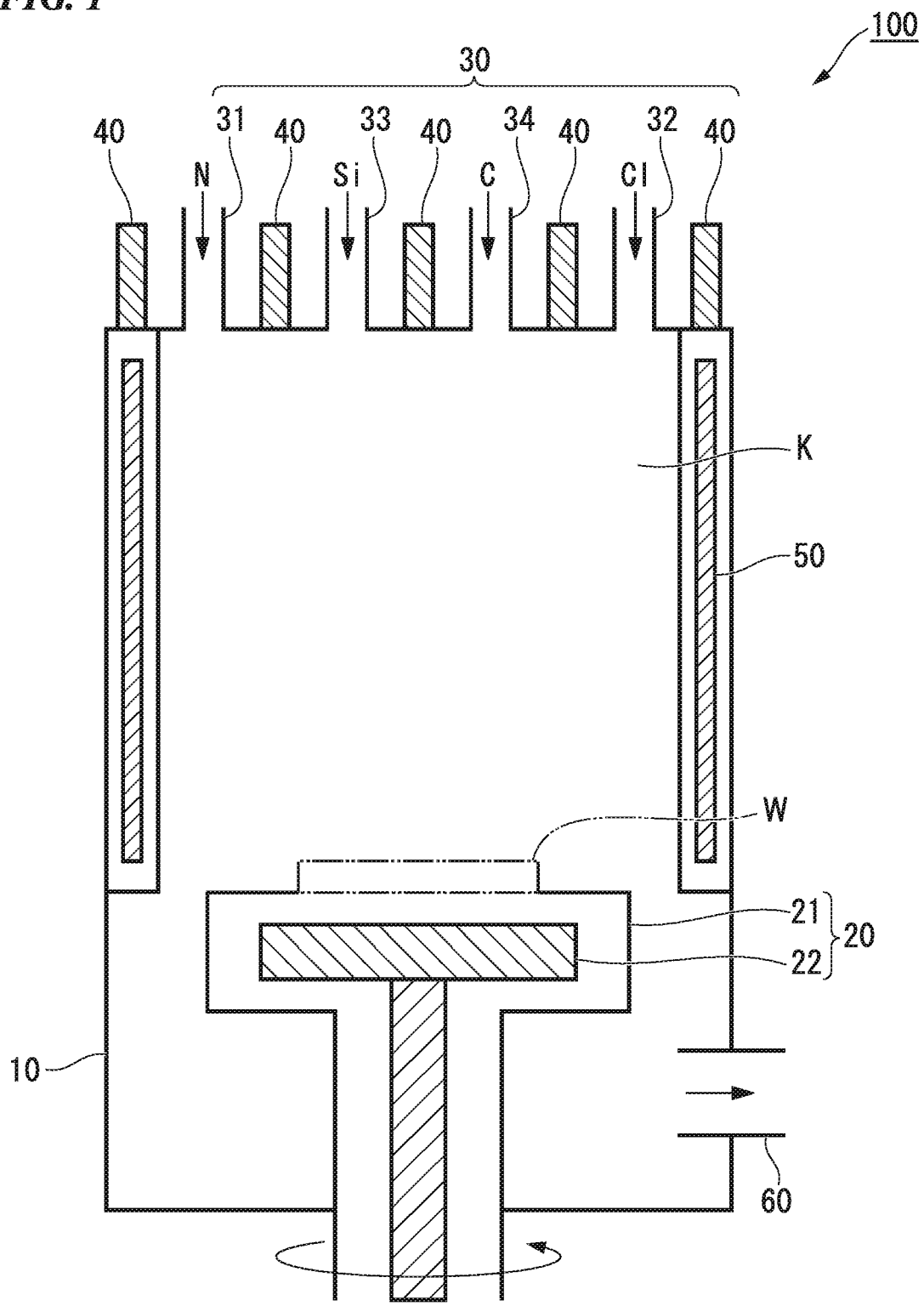
FIG. 1 is a schematic cross-sectional view schematically illustrating a SiC chemical vapor deposition apparatus according to an embodiment of the present invention.

A SiC epitaxial growth apparatus and a method for manufacturing a SiC epitaxial wafer that represent applications of the present invention are described below in detail with appropriate reference to the drawings.

The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the cope of the present invention.

(SiC Chemical Vapor Deposition Apparatus)

One example of a SiC epitaxial growth apparatus 100 according to a first embodiment of the present invention is described below with reference to FIG. 1.

The SiC epitaxial growth apparatus 100 according to the first embodiment of the present invention includes a furnace body 10 that forms a growth space K, a mounting stage 20, provided inside the furnace body 10, on which a SiC wafer W is mounted, and gas inlet piping 30 through which gas is introduced into the furnace body 10. The gas inlet piping 30 has a N-based gas inlet pipe 31 for introducing a basic N-based gas composed of molecules containing an N atom within the molecular structure but having neither a double bond nor a triple bond between nitrogen atoms, and a Cl-based gas inlet pipe 32 for introducing a Cl-based gas composed of molecules containing a Cl atom within the molecular structure, and the N-based gas inlet pipe 31 and the Cl-based gas inlet pipe 32 are mutually separate. A heating device 40 that is capable of heating to a temperature equal to or higher than the boiling point or sublimation temperature of a solid product generated by mixing the N-based gas and the Cl-based gas is provided at the inlet ports of the N-based gas inlet pipe 31 and the Cl-based gas inlet pipe 32.

FIG. 1 illustrates a vertical chemical vapor deposition apparatus in which the substrate for growth is positioned at the lower end of the apparatus, and the raw material gases are supplied from the upper end and flow from top to bottom to initiate epitaxial growth. The SiC chemical vapor deposition apparatus according to one aspect of the present invention is not limited to vertical chemical vapor deposition apparatus, and may also be a horizontal chemical vapor deposition apparatus.

The SiC epitaxial growth apparatus 100 is an apparatus for manufacturing SiC epitaxial wafers. The raw material gases supplied from the gas inlet piping 30 of the SiC epitaxial growth apparatus 100 react on the SiC wafer W mounted on the mounting stage 20, forming a SiC epitaxial film on the SiC wafer W. As a result of this type of reaction, a SiC epitaxial wafer having a SiC epitaxial film formed on the SiC wafer W can be manufactured. A Si-based gas and a C-based gas are used as the raw material gases.

Examples of the Si-based gas include silane-based gases such as silane ($SiH_4$). Other gases that may be used include chlorine-based Si atom-containing gases (chloride-based raw materials) such as $SiH_2Cl_2$, $SiHCl_3$ and $SiCl_4$ which contain a Cl that has an etching action. Examples of gases that may be used as the C-based gas include propane ($C_3H_8$) and the like.

The gas inlet piping 30 can also introduce gases besides these raw material gases. Examples of these gases besides the raw material gases include the plurality of gases described below. One example of a gas besides the raw material gases is HCl, which is introduced for the purposes of suppressing Si nucleus growth in the gas phase and suppressing the formation of Si liquid droplets on the surface of the wafer. Other gases that may be introduced include impurity doping gases or the like used for controlling the conductivity type of the SiC epitaxial film layered onto the SiC wafer W. Examples of impurity doping gases that may be used in the case of n-type conductivity include methylamine ($CH_5N$), dimethylamine ($C_2H_7N$), trimethylamine ($C_3H_9N$), aniline ($C_6H_7N$), ammonia ($NH_3$), hydrazine ($N_2H_4$), dimethylhydrazine ($C_2H_8N_2$) and other amines. Furthermore, in the case of p-type conductivity, examples of impurity doping gases that may be used include TMA (trimethylaluminum) and the like. Moreover, a carrier gas or purge gas or the like may be introduced to support the gas flow so that the raw material gases can be supplied efficiently to the SiC wafer W. Examples of this type of carrier gas or purge gas include gases including $H_2$ that have an etching action, and inert gases (rare gases) such as Ar and He.

The various types of gases described above can be used to manufacture SiC epitaxial wafers, but in the detailed description of the present invention, for the sake of convenience, these gases are differentiated into six categories, namely "Si-based gases", "C-based gases", "Cl-based gases", "N-based gases", "other impurity doping gases" and "other gases".

A "Si-based gas" (shown as Si in FIG. 1) is a gas in which the molecules that constitute the gas include Si as a constituent element. Examples of gases that correspond with this definition include silane ($SiH_4$), dichlorosilane ($SiH_2Cl_2$), trichlorosilane ($SiHCl_3$) and tetrachlorosilane ($SiCl_4$). A Si-based gas is generally used as one of the raw material gases.

A "C-based gas" (shown as C in FIG. 1) is a gas in which the molecules that constitute the gas include C as a constituent element. Examples of gases that correspond with this definition include propane ($C_3H_8$) and the like. A C-based gas is generally used as one of the raw material gases.

A "Cl-based gas" (shown as Cl in FIG. 1) is a gas in which the molecules that constitute the gas include Cl as a constituent element. Examples of gases that correspond with this definition include hydrogen chloride (HCl), dichlorosilane ($SiH_2Cl_2$), trichlorosilane ($SiHCl_3$) and tetrachlorosilane ($SiCl_4$). Of these, dichlorosilane ($SiH_2Cl_2$), trichlorosilane ($SiHCl_3$) and tetrachlorosilane ($SiCl_4$) are also Si-based gases. In this manner, some gases may be both a "Cl-based gas" and a "Si-based gas". However, in the present invention, only the "Cl-based gas" and the "N-based gas" must be strictly differentiated, and provided a gas does not satisfy the definitions for both a "Cl-based gas" and a "N-based gas" gas which belongs to two different gas types may exist.

A "N-based gas" (shown as N in FIG. 1) is a basic gas in which the molecules that constitute the gas include N as a constituent element but have neither a double bond nor a triple bond between nitrogen atoms. Examples of gases that correspond with this definition include any gas selected from, the group consisting of methylamine ($CH_5N$), dimethylamine ($C_2H_7N$), trimethylamine ($C_3H_9N$), aniline ($C_6H_7N$), ammonia ($NH_3$), hydrazine ($N_2H_4$), dimethylhydrazine ($C_2H_8N_2$) and other amines. In other words, despite the fact that $N_2$ is a gas in which the molecules that constitute the gas include N as a constituent element, it does not correspond with a N-based gas. A N-based gas is generally used as an impurity doping gas.

"Other impurity doping gases" (not shown in the drawing) are impurity doping gases other than a N-based gas or Cl-based gas. Examples corresponding gases include $N_2$ and TMA.

"Other gases" (not shown the drawing) are gases that do not belong to any of the above five categories. Examples of corresponding gases include Ar, He and $H_2$. These gases are used to support the manufacture of the SiC epitaxial wafer and are generally used to support the gas flow so that the raw material gases can be supplied efficiently to the SiC wafer W.

When a basic N-based gas and an acidic Cl-based gas are mixed, a chemical reaction occurs and a solid product is produced. For example, when ammonia as the N-based gas and hydrogen chloride as the Cl-based gas are mixed, ammonium chloride ($NH_4Cl$) is formed. Alternatively, when methylamine ($CH_5N$) as the N-based gas and hydrogen chloride as the Cl-based gas are mixed, monomethylamine hydrochloride ($CH_5N \cdot HCl$) is formed. Moreover, it has been reported that when ammonia as the N-based gas and dichlorosilane as the Cl-based gas are mixed, ammonium chloride is formed (for example, see Japanese Patent Application No. 1992-024921). The sublimation temperature of ammonium chloride is 338° C., whereas the melting point of monomethylamine hydrochloride is 220 to 230° C. and the boiling point is 225 to 230° C. In other words, these solid products are formed at temperatures below these respective temperatures.

Unlike the epitaxial growth of GaN or the like, a N-based gas can be used as a doping gas during the epitaxial growth of SiC. Accordingly, the flow rate of the N-based gas is lower than that of the Si-based gas and the C-based gas that function as the raw material gases. In contrast, the flow rate of the Cl-based gas is generally similar to the flow rates of the Si-based gas and the C-based gas, or even greater than the flow rates of the Si-based gas and the C-based gas. The volumetric flow rate of the Cl-based gas during the epitaxial growth of SiC is generally 10 times or more that of the N-based gas. As a result, compared with the epitaxial growth of GaN and the like, the number of particles arising from solid products has typically been small. However, in recent years, with the trend toward larger and higher quality SiC epitaxial wafers, even with a low N-based gas flow rate, the number of particles generated has resulted in a level of defects that has become problematic. When these particles arising from solid products adhere to the wafer surface, they generate SiC epitaxial defects. For example, particles generated from solid products can inhibit step-flow growth of the SiC and generate triangular defects originating from the particles.

[Gas Inlet Piping]

In FIG. 1, the gas inlet piping 30 is illustrated with a structure in which the N-based gas inlet pipe 31 for introducing the N-based gas, the Cl-based gas inlet pipe 32 for introducing the Cl-based gas, a Si-based gas inlet pipe 33 for introducing the Si-based gas, and a C-based gas inlet pipe 34 for introducing the C-based gas are each mutually separate. Any structure in which the N-based gas inlet pipe 31 and the Cl-based gas inlet pipe 32 are separate may be used, and the Si-based gas inlet pipe 33 and the C-based gas inlet pipe 34 need not necessarily be separate pipes. In other words, the Si-based gas may be introduced through the N-based gas inlet pipe 31, the Cl-based gas inlet pipe 32 or the C-based gas inlet pipe 34, and the C-based gas may be introduced through the N-based gas inlet pipe 31, the Cl-based gas inlet pipe 32 or the Si-based gas inlet pipe 33. However, in those cases where the Si-based gas or the C-based gas is also a Cl-based gas, it must not be introduced from the N-based gas inlet pipe. Besides the gas inlet pipes described above, other gas inlet pipes for introducing other impurity doping gases or other gases may also be provided separately. These other impurity doping gases or other gases may also be introduced from the N-based gas inlet pipe 31, the Cl-based gas inlet pipe 32, the Si-based gas inlet pipe 33, or the C-based gas inlet pipe 34. Furthermore, each gas inlet pipe need not necessarily be restricted to a single pipe for each gas, and may have a plurality of inlet pipes.

Because the N-based gas and the Cl-based gas are introduced separately, formation of any solid product can also be suppressed in the piping and the like outside of the SiC epitaxial growth reaction space. During formation of the SiC epitaxial film in the SiC epitaxial growth apparatus 100, the temperature inside the furnace body 10 is generally high. However, the piping that supplies each of the gases is usually not heated. Accordingly, if the N-based gas and the Cl-based gas are not introduced separately, then then a solid product is produced inside the piping. This solid product produced inside the piping passes through the piping, and flies out from the gas inlet piping 30 and onto the SiC wafer in the form of particles, causing SiC epitaxial wafer defects. In other words, by introducing the N-based gas and the Cl-based gas separately, formation of the solid product in the piping and the like is inhibited, and a SiC epitaxial wafer can be manufactured with a reduction in the number of defects associated with the solid product.

Further, as illustrated in FIG. 1, when a plurality of gas inlet pipes are provided, the N-based gas inlet pipe 31 and the Cl-based gas inlet pipe 32 are preferably positioned at mutually distant locations. By ensuring that the N-based gas inlet pipe 31 and the Cl-based gas inlet pipe 32 have a distant positional relationship, the time required for the N-based gas and the Cl-based gas to begin mixing can be lengthened. This lengthening of the time required for the N-based gas and the Cl-based gas to begin mixing is equivalent to reducing the size of the region inside the reaction space K in which the N-based gas and the Cl-based gas exist in a mixed state, and can therefore further reduce the probability of a solid product being produced.

Furthermore, the Si-based gas and the C-based gas are also preferably introduced separately. When the Si-based gas and the C-base gas react, a SiC product is produced. If the SiC product is formed on the SiC wafer W then it becomes part of the SiC epitaxial layer, but if mixing occurs in the initial portion of the reaction space (near the gas inlet piping or inside the piping), then unwanted SiC product is produced. Accordingly, if the Si-based gas and the C-based gas are mixed prior to introduction, then there is a possibility that unwanted SiC product may form inside the gas inlet piping 30 or on the surfaces of the walls of the furnace body 10. If this type of unwanted SiC product detaches from the gas inlet piping 30 or the surfaces of the walls of the furnace body 10 or the like, it forms particles which may then cause defects on the SiC epitaxial wafer.

Figure 2:
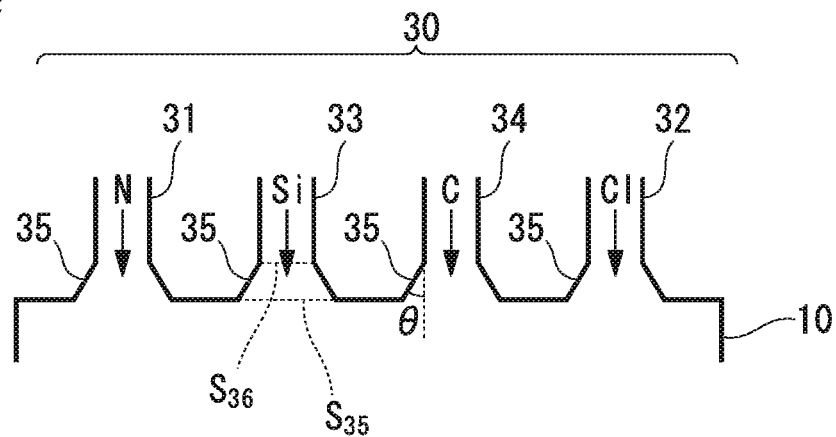
FIG. 2 is a schematic cross-sectional view schematically describing SiC chemical vapor deposition apparatus according to an embodiment of the present invention, and is a schematic cross-sectional view of a SiC chemical vapor deposition apparatus in which the inlet ports of the gas inlet pipes are tapered. For simplicity reasons, the lower portion of the furnace body is not shown.

Inlet ports 35 of the gas inlet piping 30 preferably have a tapered shape. FIG. 2 is a schematic cross-sectional view schematically describing a SiC chemical vapor deposition apparatus according to an embodiment of the present invention, and is a schematic cross-sectional view of a SiC chemical vapor deposition apparatus in which the inlet ports of the gas inlet pipes are tapered. For simplicity reasons, the lower portion of the furnace body is not shown in the drawing.

By employing this structure, swirling of the gases in the vicinity of the inlet ports 35 of the gas inlet piping 30 can be suppressed. In other words, adhesion of deposits around the inlet, ports 35 of the gas inlet piping 30 can be suppressed. In FIG. 2, tapers are provided around all of the inlet ports of the various gas inlet pipes, but some inlet ports may not be tapered. Among the five gas categories described above, the possibility of deposit adhesion around the inlet port 35 is highest for the Si-based gas inlet pipe 33 and the C-based gas inlet pipe 34 used for introducing the Si-based gas and the C-based gas respectively. Accordingly, a taper is preferably provided at the inlet ports for the Si-based gas inlet pipe 33 and the C-based gas inlet pipe 34.

The gradient angle θ of the taper of the inlet port 35 is preferably at least 5° but not more than 45°, and more preferably at least 10° hut not more than 30°, relative to a line of extension from the gas inlet path 36. Provided the gradient angle θ is at least 5° but not more than 45°, swirling of the gas can be satisfactorily suppressed, and the adhesion of deposits around the inlet port 35 can be efficiently inhibited.

The cross-sectional area $S_{35}$ of the inlet port 35 at the final edge on the side of the furnace body 10 is preferably at least 1.5 times but not more than 6 times, and more preferably at least 2 times but not more than 4 times, the cross-sectional area $S_{36}$ of the gas inlet path 36 at a point immediately prior to the inlet port 35. If the shape of the gas inlet piping 30 has this type of shape, then the change in the gas flow rate satisfies a prescribed range, and gas swirling can be satisfactorily prevented. In other words, the adhesion of deposits around the inlet port 35 can be efficiently inhibited.

The average flow velocity (flow volume/cross-sectional area $S_{36}$) inside the gas inlet path 36 of gas supplied to the interior of the furnace body 10 from the gas inlet piping 30 is preferably within a range from 0.001 m/s to 100 m/s, and more preferably from 0.01 m/s to 10 m/s. By ensuring that the gas flow velocity satisfies a the occurrence of flow turbulence in the vicinity of the inlet port 35 can be suppressed. In other words, the adhesion of deposits around the inlet port 35 can be efficiently inhibited.

A configuration may also be used in which the periphery of the gas inlet piping 30 is surrounded with an outer pipe 37, so that the gas inlet piping 30 and the outer pipe 37 form a double pipe structure in which a purge gas (other gas) p can be introduced into the furnace body 10 from the space between the gas inlet piping 30 and the outer pipe 37.

Figure 3:
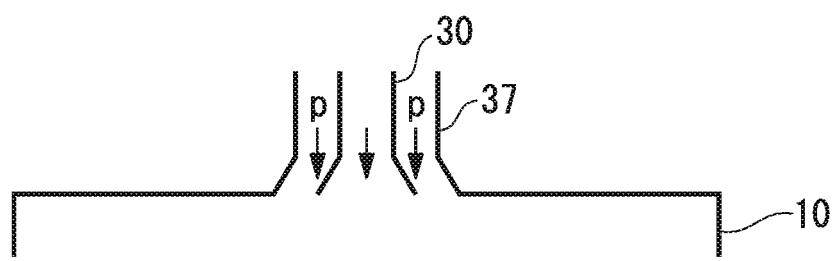
FIG. 3 is a schematic cross-sectional view schematically describing a SiC chemical vapor deposition apparatus according to an embodiment of the present invention, and is a schematic cross-sectional view of a SiC chemical vapor deposition apparatus in which the inlet port of a gas inlet pipe and an outer pipe both have tapered shapes. For simplicity reasons, the lower portion of the furnace body is not shown.

FIG. 3 is a schematic cross-sectional view schematically describing a SiC chemical vapor deposition apparatus in which the gas inlet piping 30 is covered with the outer pipe 37, so that the gas inlet piping 30 and the outer pipe 37 form a double pipe structure. For simplicity reasons, the lower portion of the furnace body 10 is not shown. The gas inlet piping 30 illustrated in FIG. 3 may be any one of the N-based gas inlet pipe 31, the Cl-based gas inlet pipe 32, the Si-based gas inlet pipe 33, and the C-based gas inlet pipe 34. The purge gas p prevents the gas (Si-based gas, C-based gas, N-based gas or Cl-based gas) from swirling back into the gas inlet piping 30, and can therefore more effectively inhibit the adhesion of deposits of SiC products or solid products around the inlet port of the gas inlet piping 30. In other words, the generation of deposits that can cause defects on the SiC epitaxial wafer can be suppressed.

In FIG. 3, although the inlet port of the outer pipe 37 into furnace body has a tapered shape, this inlet port need not necessarily have a tapered shape, and may be formed linearly. Forming the inlet port of the outer pipe 37 into the furnace body with a tapered shape enables the purge gas to flow more smoothly, and can suppress the occurrence of flow turbulence. When the outer pipe 37 has a tapered shape, the gradient angle of the taper is preferably the same as the gradient angle of the taper of the gas inlet piping 30. If the gradient angles of the tapers of the outer pipe 37 and the gas inlet piping 30 are the same, unnecessary flow turbulence can be suppressed.

Figure 4:
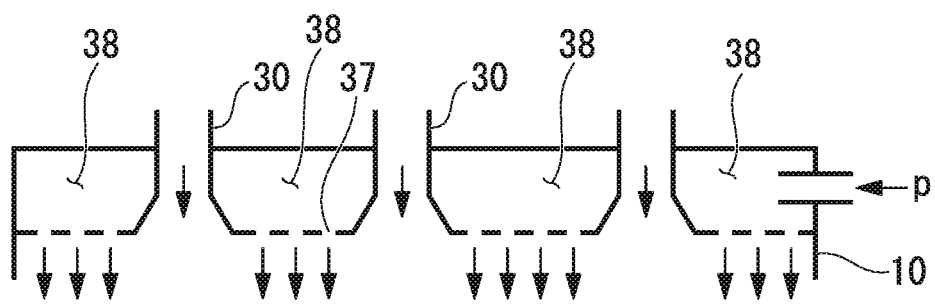
FIG. 4 is a schematic cross-sectional view schematically describing a SiC chemical vapor deposition apparatus according to an embodiment of the present invention, and is a schematic cross-sectional view of a SiC chemical vapor deposition apparatus in which the purge gas is supplied in a shower-like stream around the periphery of the gas inlet pipes via a front chamber for deposition. For simplicity reasons, the lower portion of the furnace body is not shown.

The inlet port for the purge gas (other gas) may be formed with a shower head shape around the periphery of the gas inlet piping 30. FIG. 4 is a schematic cross-sectional view of a SiC chemical vapor deposition apparatus in which a plurality of purge gas inlet ports 37 are provided around the periphery of the gas inlet piping 30. For simplicity reasons, the lower portion of the furnace body 10 is not shown in the drawing. The gas inlet piping 30 illustrated in FIG. 4 may be any one of the N-based gas inlet pipe 31, the Cl-based gas inlet pipe 32, the Si-based gas inlet pipe 33, and the C-based gas inlet pipe 34.

As illustrated in FIG. 4, the purge gas is supplied to a front chamber for deposition 38. As the purge gas is supplied, the pressure inside the front chamber for deposition 38 increases. As a result, the purge gas p is supplied through the purge inlet ports 37 and into the interior of the furnace body 10 in a shower-like form. By employing this type of configuration, the purge gas p supplied to the furnace body 10 from the purge gas inlet ports 37 can prevent swirling of the gas (Si-based gas, C-based gas, N-based gas, or Cl-based gas).

Although there are no particular limitations on the material used for forming the gas inlet piping 30, the inclusion of a material having an emissivity of at least 0.5 is preferred. The growth of silicon carbide occurs at a high temperature of 1,500° C. or higher, and therefore heating by radiation plays a play large role. Metals such as stainless steel that are typically used for gas piping have an emissivity of less than 0.5, and are therefore unable to efficiently absorb thermal radiation.

By selecting a substance having a large emissivity, and using material having an emissivity of at least 0.5, the material can absorb radiation satisfactorily, and the gas inlet piping 30 can be heated efficiently. A higher emissivity is preferred, and a value of 0.6 or greater is particularly desirable.

Examples of materials having an emissivity of at least 0.5 include C, SiC, metal carbides, and carbon that have been coated with SiC or a metal carbide. Further, a mixture of these types of materials may also be used as the material having an emissivity of at least 0.5, and a material containing at least one of the above materials is preferred. Examples of metal carbides that may be used include WC and NbC. These materials have a high emissivity and readily absorb radiation.

By including one of these materials in the material for the gas inlet piping 30, the gas inlet piping 30 can be heated by thermal radiation from inside the furnace body 10. In other words, the temperature of the N-based gas inlet pipe and the Cl-based gas inlet pipe can easily be increased to the boiling point or sublimation temperature of the solid product obtained by mixing the N-based gas and the Cl-based gas.

[Heating Device]

The heating device 40 is installed at least in the vicinity of the inlet ports of the N-based gas inlet pipe 31 and the Cl-based gas inlet pipe 32. The heating device 40 is capable of heating the inlet ports of the N-based gas inlet pipe 31 and the Cl-based gas inlet pipe 32 to a temperature equal to or higher than the boiling point or sublimation temperature of the solid product produced by mixing the N-based gas and the Cl-based gas. Because the boiling point or sublimation temperature of the solid product produced by mixing the N-based gas and the Cl-based gas is typically not more than 300° C., the heating device 40 should be capable of heating the inlet ports of the N-based gas inlet pipe 31 and the Cl-based gas inlet pipe 32 to a temperature of at least 300° C.

Using the heating device 40, the inlet ports of the N-based gas inlet pipe 31 and the Cl-based gas inlet pipe 32 are heated to a temperature equal to or higher than the boiling point or sublimation temperature of the solid product produced by mixing the N-based gas and the Cl-based gas. As a result of this heating, the temperature upon mixing of the N-based gas and the Cl-based gas is equal to or higher than the boiling point or sublimation temperature of the solid product generated by mixing the two gases. As a result, even if these gases are mixed inside the reaction space K, no solid product is formed, and a SiC epitaxial wafer can be manufactured with a reduction in the number of defects associated with the solid product.

The heating device 40 may use a resistance heating method or a high-frequency heating method. The heating device 40 may be any device that is capable of heating at least the inlet ports of the N-based gas inlet pipe 31 and the Cl-based gas inlet pipe 32, but as illustrated in FIG. 1, the inlet ports of the other gas inlet pipes may also be heated. By heating the vicinity of the inlet port for each gas, the temperature difference between the mounting stage 20 and the gas inlet piping 30 can be reduced, which can suppress thermal convection inside the furnace body 10.

[Furnace Body]

The furnace body 10 has a hollow section that constitutes the growth chamber. Each of the gases is introduced into the furnace body 10 from the gas inlet piping 30, and is discharged from a gas discharge port 60. The mounting stage 20 is installed inside the hollow section, and the SiC wafer W is mounted on the mounting stage 20, enabling deposition of a SiC epitaxial film. There are no particular limitations on the furnace body 10, which is generally produced from a metal such as SUS.

The furnace body 10 preferably has a structure in which the temperature of the space between the inlet ports of the gas inlet piping 30 and the mounting stage 20 can be set to a temperature equal to or higher than the boiling point or sublimation temperature of the solid product produced by mixing the N-based gas and the Cl-based gas. A specific example of this type of structure is described below.

For example, as illustrated in FIG. 1, a furnace body heating device 50 capable of heating the space between the inlet ports of the gas inlet piping 30 and the mounting stage 20 can be provided. In FIG. 1, the furnace body heating device 50 is housed inside the furnace body 10, but a furnace body heating device may also be installed outside the furnace body 10.

A material having a high emissivity may be used as the material that constitutes the inside walls of the space between the inlet ports of the gas inlet piping 30 of the furnace body 10 and the mounting stage 20. This material having a high emissivity as an emissivity that is preferably at least 0.5, and more preferably 0.6 or greater. Examples of such materials include those described above in relation to the material for the gas inlet piping.

A thermal insulation material or a heat shield may be installed around the periphery of the reaction space K of the furnace body 10 (not shown in the drawing). By installing a thermal insulation material or a heat shield, the temperature between the inlet ports of the gas inlet piping 30 of the furnace body 10 and the mounting stage 20 is more resistant to falls in temperature.

By employing this type of configuration, the temperature of the reaction space between the inlet ports of the gas inlet piping 30 of the furnace body 10 and the mounting stage 20 can be set to a temperature equal to or higher than the boiling point or sublimation temperature of the solid product formed by mixing the N-based gas and the Cl-based gas. If the temperature of this region is set to at least this temperature, then any decrease in the temperature with increasing distance from the inlet ports can be suppressed. In other words, the chance of the solid product that was unable to form in the vicinity of the inlet ports reforming inside the furnace body can be suppressed. As a result, a SiC epitaxial wafer can be manufactured with even better reduction in the number of defects associated with the solid product.

In the furnace body 10, the distance between the inlet ports of the gas inlet piping 30 and the mounting stage 20 is preferably within a range from 200 to 2,000 mm. Provided the distance between the inlet ports of the gas inlet piping 30 and the mounting stage 20 is suitably large, even if any solid product is produced, that solid product can be gasified before falling to the surface of the epitaxial wafer. The distance between the inlet ports of the gas inlet piping and the mounting stage is more preferably from 300 to 1,000 mm. If the distance is too large, then the furnace body heating device 50 must be increased in size, which is undesirable in terms of apparatus costs and running costs.

The furnace body 10 may have a vertical furnace structure in which the gas inlet piping is positioned above the mounting stage. In a vertical furnace structure, the furnace body that functions as the reaction space is larger. As the reaction space becomes larger, radiation has a greater effect on the region surrounding the wafer, and therefore maintaining the temperature at a uniform level becomes more difficult. Consequently, the effect of using a N-based gas that is able to decompose before it reaches the wafer surroundings becomes more significant.

[Mounting Stage]

The mounting stage 20 has a susceptor 21 on which the SiC wafer W is mounted, and a heating mechanism 22 that heats the SiC wafer W mounted on the susceptor 21. The upper surface of the susceptor 21 functions as the mounting surface for the SiC wafer W, whereas a space is formed inside the susceptor to house the heating mechanism 22. The susceptor 21 is provided with a pipe-shaped support axis that extends in the downward direction, and by connecting this support axis to a rotation mechanism not shown in the drawing, the susceptor is able to be rotated. The heating mechanism 22 is composed of a heater or the like that opposes the mounting surface for the SiC wafer W, and is housed inside the susceptor 21. The heating mechanism 22 is supplied with power from an external source through the interior of the susceptor 21. The SiC wafer W can be heated to a temperature of 1,500° C. or higher.

[Gas Discharge Port]

The gas discharge port 60 is positioned below the SiC wafer W mounting surface on the mounting stage 20 inside the furnace body 10, and discharges unreacted gases that have moved past the SiC wafer W. Vacuum suction is applied from the gas discharge port 60, enabling the atmospheric pressure inside the furnace body 10 to be adjusted as appropriate.

(Method for Manufacturing SiC Epitaxial Wafer)

The method for manufacturing a SiC epitaxial wafer according to the present invention includes separately introducing, into a reaction space for SiC epitaxial growth, a basic N-based gas composed of molecules containing an N atom within the molecular structure but having neither a double bond nor a triple bond between nitrogen atoms, and a Cl-based gas composed of molecules containing a Cl atom within the molecular structure, and mixing the N-based gas and the Cl-based gas at a temperature equal to or higher than the boiling point or sublimation temperature of a solid product generated by mixing the N-based gas and the Cl-based gas.

In the method for manufacturing a SiC epitaxial wafer according to the present invention, introducing the N-based gas and the Cl-based gas separately into the reaction space for SiC epitaxial growth can be achieved, as described above, by separating the inlet piping and pipes for each gas.

The N-based gas and the Cl-based gas are mixed at a temperature equal to or higher than the boiling point or sublimation temperature of a solid product generated by mixing the N-based gas and the Cl-based gas. In the SiC chemical vapor deposition apparatus of FIG. 1, this is achieved by heating the inlet ports of the N-based gas inlet pipe 31 sand the Cl-based gas inlet pipe 32 with the heating device 40, but the method for manufacturing a SiC epitaxial wafer according to one aspect of the present invention is not limited to this particular configuration.

Figure 5:
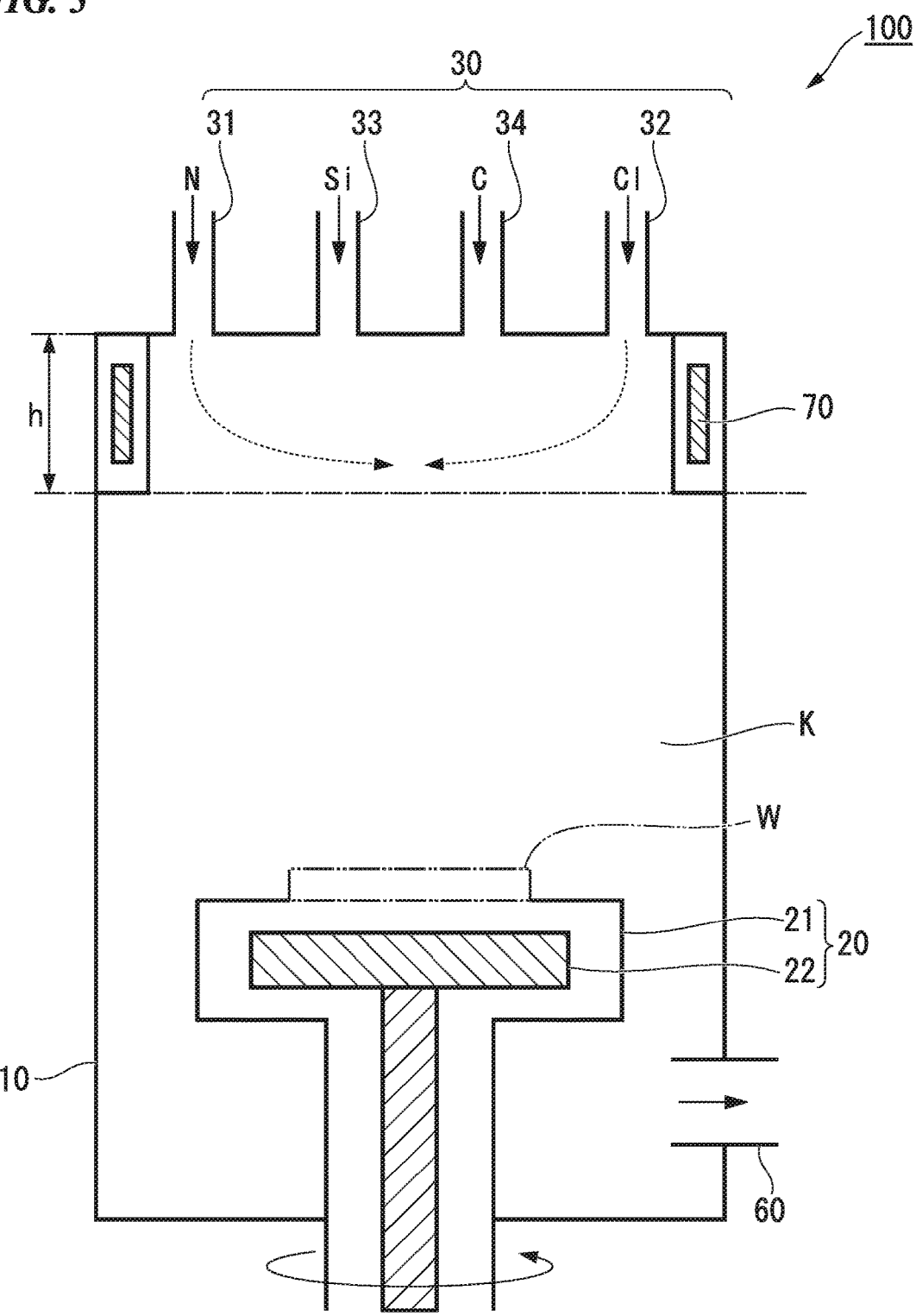
FIG. 5 is a schematic cross-sectional view schematically illustrating a SiC chemical vapor deposition apparatus according to an embodiment of the present invention.

FIG. 5 is a schematic cross-sectional view schematically illustrating a SiC chemical vapor deposition apparatus according to one aspect of the present invention. As illustrated by the dotted lines in FIG. 5. The N-based gas and the Cl-based gas introduced into the reaction space K flow independently, and begin mixing at the point where the two gas streams make contact. In other words, within the space having a height h from the upper surface of the furnace body 10 on the side of the gas inlet piping 30, the N-based gas and the Cl-based gas are not mixed. Accordingly, within the region shown above this space in the drawing, the solid product is not produced even if heating is not performed.

In other words, the inlet ports of the gas inlet piping 30 need not necessarily be heated, and generation of the solid product may be suppressed by using a furnace body upper portion heating device 70 such as that illustrated in FIG. 5 to heat the region before the N-based gas and the Cl-based gas undergo mixing.

Rather than providing the heating device 40, a material having a high emissivity may be used as the material for producing the gas inlet piping 30. Specifically, a material having an emissivity of at least 0.5 may be used. For example, when a SiC epitaxial wafer is manufactured, the temperature of the mounting surface for the SiC wafer W is heated to about 1,600° C. Accordingly, if the material used for producing the gas inlet piping 30 has a high emissivity, then the material absorbs the resulting thermal radiation, and the temperature of the gas inlet piping 30 can be increased to a temperature equal to or higher than the boiling point or sublimation temperature of the solid product even without providing a heating device or the like.

Although preferred embodiments of the present invention have been described above in detail, the present invention is in no way limited by these specific embodiments and various alterations and modifications are possible within the scope of present invention disclosed within the claims.

EXAMPLES

The effects of the present invention are described below using a series of specific examples. However, the present invention is in no way limited by these examples.

In the following examples, a SiC epitaxial wafer was grown, and the in-plane uniformity of the carrier density and the density of surface defects (such as downfalls and triangular defects) were measured for the formed SiC epitaxial wafer.

Example 1

A vertical SiC chemical vapor deposition apparatus was used as the SiC chemical vapor deposition apparatus. Growth of the SiC epitaxial film was performed using trichlorosilane ($SiHCl_3$) and propane ($C_3H_8$) as the raw material gases, and with simultaneous supply of hydrogen chloride (HCl) gas and ammonia gas ($NH_3$) as an impurity doping gas. Hydrogen and argon were used as the carrier gas and purge gas. In other words, in Example 1, the Cl-based gases were the trichlorosilane and hydrogen chloride gases, and the N-based gas was ammonia.

In the reaction space of the SiC chemical vapor deposition apparatus, there were two types of gas inlet pipes for introducing these gases (with a plurality of each of the Si-based gas inlet pipes and the N-based gas inlet pipes), and the trichlorosilane and the hydrogen chloride gas were introduced from the first gas inlet pipes, and the propane gas and the ammonia introduced from the second gas inlet pipes. In other words, in Example 1, the Cl-based gas and the N-based gas were introduced separately. The inlet ports of the first gas inlet pipes and the second gas inlet pipes were heated by a heater to 1,000° C. The solid product formed when trichlorosilane or hydrogen chloride gas and ammonia are mixed is ammonium chloride. The 1,000° C. heated by the heater is higher than the 338° C. melting point of the ammonium chloride. The pressure during deposition was set to 26.7 kPa (200 Torr), the deposition rate was set to 57 m/h and the ammonia gas flow rate was set to 0.1 sccm. Under these conditions, a SiC epitaxial film was grown on the surface of a 4-inch SiC wafer.

Comparative Example 1

Comparative Example 1 differed from Example 1 in the use of nitrogen gas instead of ammonia gas as the carrier gas. The nitrogen gas flow rate was set to 14.2 sccm. All other conditions were the same as Example 1. Nitrogen gas has a triple bond between the N atoms, and therefore is not classified as a N-based gas.

The deviation value in the in-plane uniformity of the carrier density of the SiC epitaxial wafer prepared in Example 1 was 18%, whereas the deviation value in the in-plane uniformity of the carrier density of the SiC epitaxial wafer prepared in Comparative Example 1 was 132%. This deviation value in the in-plane uniformity was determined by taking the difference between the "maximum in-plane carrier density" and the "minimum in-plane carrier density", and dividing the difference by the "average in-plane carrier density". A smaller difference between the maximum and minimum carrier densities yields a lower deviation value in the in-plane, uniformity. In other words, the in-plane uniformity in Example 1 was higher than the in-plane uniformity in Comparative Example 1.

The surface defect density in Example 1 was 0.14 cm$^{-2}$, and the surface defect density in Comparative Example 1 was also 0.14 cm$^{-2}$. In other words, despite the use of ammonia in Example 1, there was no increase in the surface defect density.

Example 2

Example 2 differed from Example 1 in that the pressure during SiC epitaxial wafer growth was set to 3.3 kPa (25 Torr) and the growth rate was set to 48 μm/h. All other conditions were the same as Example 1.

Comparative Example 2

Comparative Example 2 differed from Comparative Example 1 in that the pressure during SiC epitaxial wafer growth was set to 3.3 kPa (25 Torr) and the growth rate was set to 48 μm/h. All other conditions were the same as Comparative Example 1.

The deviation value in the in-plane uniformity of the carrier density of the SiC epitaxial wafer prepared in Example 2 was 9%, whereas the deviation value in the in-plane uniformity of the carrier density of the SiC epitaxial wafer prepared in Comparative Example 2 was 110%. The in-plane uniformity in Example 2 was higher than the in-plane uniformity in Comparative Example 2.

The surface defect density in Example 2 was 0.00 cm$^{-2}$, and the surface defect density in Comparative Example 2 was 0.29 cm$^{-2}$. In other words, despite the use of ammonia in Example 2, the surface defect density did not increase.

Example 3

Example 3 differed Example 2 only in that the size of the SiC epitaxial wafer was increased to 6 inches. All other conditions were the same as Example 2.

The deviation value in the in-plane uniformity of the carrier density of the SiC epitaxial (wafer prepared in Example 3 was 21%. Despite using a large diameter wafer of 6 inches, a high level of in-plane uniformity was able to be achieved.

Further, the surface defect density in Example 3 was 0.05 cm$^{-2}$, indicating that despite the large diameter wafer of 6 inches, a low surface defect density was able to be achieved.

The results of the above examples and comparative examples are summarized below in Table 1.

TABLE 1

| | Wafer size | Carrier gas | In-plane uniformity deviation value (%) | Surface defect density (cm$^{-2}$) |
|---|---|---|---|---|
| Example 1 | 4 | NH$_3$ | 18 | 0.14 |
| Example 2 | 4 | NH$_3$ | 9 | 0.00 |
| Example 3 | 6 | NH$_3$ | 21 | 0.05 |
| Comparative example 1 | 4 | N$_2$ | 132 | 0.14 |
| Comparative example 2 | 4 | N$_2$ | 110 | 0.29 |

As shown in Table 1, in Examples 1 to 3, by using ammonia as the carrier gas, SiC epitaxial wafers having high in-plane uniformity of the carrier density were able to be obtained. In Examples 1 to 3, because the temperature of each of the gas inlet ports was set to a temperature equal to or higher than the boiling point or sublimation temperature of the solid product generated by mixing the N-based gas and the Cl-based gas, SiC epitaxial wafers with low surface defect density values were able to be obtained despite using ammonia gas (as the N-based gas).

INDUSTRIAL APPLICABILITY

The SiC chemical vapor deposition apparatus and the method for manufacturing a SiC epitaxial wafer according to the present invention are able to improve the uniformity of the in-plane carrier density and suppress defects in the SiC epitaxial film. Accordingly, SiC epitaxial wafers can be manufactured that can be used, for example, in power devices, high-frequency devices and high-temperature operation devices.

DESCRIPTION OF THE REFERENCE SIGNS

100: SiC chemical vapor deposition apparatus
10: Furnace body
20: Mounting stage
21: Susceptor
22: Heating mechanism
30: Gas inlet piping
31: N-based gas inlet pipe
32: Cl-based gas inlet pipe
33: Si-based gas inlet pipe
34: C-based gas inlet pipe
35: Gas inlet port 36: Gas inlet path
37: Outer pipe
38: Front chamber for deposition
40: Heating device
50: Furnace body heating device
60: Gas discharge port
70: Furnace body upper portion heating device
W: SiC wafer
K: Reaction space
N: N-based gas
Si: Si-based gas
C: C-based gas
Cl: Cl-based gas
p: Purge gas

The invention claimed is:

1. A method for manufacturing a SiC epitaxial wafer, the method comprising:

separately introducing, into a reaction space for SiC epitaxial growth, a basic N-based gas composed of molecules containing an N atom within a molecular structure thereof but having neither a double bond nor a triple bond between nitrogen atoms, and a Cl-based gas composed of molecules containing a Cl atom within a molecular structure thereof, and mixing the N-based gas and the Cl-based gas at a temperature equal to or higher than a boiling point or sublimation temperature of a solid product generated by mixing the N-based gas and the Cl-based gas.

2. The method for manufacturing a SiC epitaxial wafer according to claim 1, wherein a temperature of the entire reaction space is set to a temperature equal to or higher than a boiling point or sublimation temperature of a solid product generated by mixing the N-based gas and the Cl-based gas.

3. The method for manufacturing a SiC epitaxial wafer according to claim 1, wherein a pressure during mixing of the N-based gas and the Cl-based gas is not more than 15 kPa.

4. The method for manufacturing a SiC epitaxial wafer according to claim 1, wherein the N-based gas is a compound selected from the group consisting of methylamine ($CH_5N$), dimethylamine ($C_2H_7N$), trimethylamine ($C_3H_9N$), aniline ($C_6H_7N$), ammonia ($NH_3$), hydrazine ($N_2H_4$), dimethylhydrazine ($C_2H_8N_2$) and other amines.

5. The method for manufacturing a SiC epitaxial wafer according to claim 1, wherein the Cl-based gas is HCl or a chlorosilane-based compound.

6. A SiC epitaxial growth apparatus having:

a furnace body that forms a growth space, a mounting stage, provided inside the furnace body, on which a SiC wafer is mounted, and gas inlet piping through which gas is introduced into the furnace body, wherein the gas inlet piping has a N-based gas inlet pipe for introducing a basic N-based gas composed of molecules containing an N atom within a molecular structure thereof but having neither a double bond nor a triple bond between nitrogen atoms, and a Cl-based gas inlet pipe for introducing a Cl-based gas composed of molecules containing a Cl atom within a molecular structure thereof, the N-based gas inlet pipe and the Cl-based gas inlet pipe being mutually separate, and a heating device is provided that is capable of heating inlet ports of the N-based gas inlet pipe and the Cl-based gas inlet pipe to a temperature equal to or higher than a boiling point or sublimation temperature of a solid product generated by mixing the N-based gas and the Cl-based gas.

7. The SiC epitaxial growth apparatus according to claim 6, wherein a temperature of a space between the inlet ports of the gas inlet pipes and the mounting stage is increased to a temperature equal to or higher than a boiling point or sublimation temperature of a solid product generated by mixing the N-based gas and the Cl-based gas.

8. The SiC epitaxial growth apparatus according to claim 6, wherein a distance between the inlet ports of the gas inlet pipes and the mounting stage is within a range from 200 and 2,000 mm.

9. The SiC epitaxial growth apparatus according to claim 6, wherein the apparatus has a vertical furnace structure in which the gas inlet piping is positioned above the mounting stage.

* * * * *